(12) United States Patent
Weisse et al.

(10) Patent No.: US 9,691,849 B2
(45) Date of Patent: Jun. 27, 2017

(54) ULTRA-LONG SILICON NANOSTRUCTURES, AND METHODS OF FORMING AND TRANSFERRING THE SAME

(71) Applicant: ALPHABET ENERGY, INC., Hayward, CA (US)

(72) Inventors: Jeffrey M. Weisse, Sunnyvale, CA (US); John P. Reifenberg, Pleasanton, CA (US); Lindsay M. Miller, Berkeley, CA (US); Matthew L. Scullin, San Francisco, CA (US)

(73) Assignee: Alphabet Energy, Inc., Hayward, CA (US)

( * ) Notice: Subject to any disclaimer, the term of this patent is extended or adjusted under 35 U.S.C. 154(b) by 0 days.

(21) Appl. No.: 14/682,471

(22) Filed: Apr. 9, 2015

(65) Prior Publication Data
US 2016/0035829 A1 Feb. 4, 2016

Related U.S. Application Data (60) Provisional application No. 61/978,026, filed on Apr. 10, 2014.

(51) Int. Cl.
*H01L 35/34* (2006.01)
*H01L 35/28* (2006.01)
(Continued)

(52) U.S. Cl.
CPC .... *H01L 29/0676* (2013.01); *H01L 21/02532* (2013.01); *H01L 21/02603* (2013.01);
(Continued)

(58) Field of Classification Search
USPC .......................................................... 257/9
See application file for complete search history.

(56) References Cited

U.S. PATENT DOCUMENTS 2,588,254 A  3/1952  Lark-Horovitz et al.
3,441,812 A  4/1969  De Bucs et al.
(Continued)

FOREIGN PATENT DOCUMENTS

CN  1352468  6/2002
CN  1957483  5/2007
(Continued)

OTHER PUBLICATIONS

European Patent Office, Extended European Search Report for EP Application No. 12790253.4, mailed Sep. 21, 2015.
(Continued)

*Primary Examiner* — Michelle Mandala
*Assistant Examiner* — Thai T Vuong
(74) *Attorney, Agent, or Firm* — K&L Gates LLP (57) ABSTRACT

Under one aspect, a plurality of silicon nanostructures is provided. Each of the silicon nanostructures includes a length and a cross-section, the cross-section being substantially constant along the length, the length being at least 100 microns. Under another aspect, a method of making nanostructures is provided that includes providing a silicon wafer including a thickness and first and second surfaces separated from one another by the thickness; forming a patterned layer of metal on the first surface of the silicon wafer; generating a current through the thickness of the silicon wafer, the metal oxidizing the silicon wafer in a region beneath the patterned layer of the metal; and exposing the silicon wafer to an etchant in the presence of the current, the etchant removing the oxidized region of the silicon wafer so as to define a plurality of nanostructures. Methods of transferring nanowires also are provided.

15 Claims, 5 Drawing Sheets

(51) Int. Cl.
  *H01L 35/30* (2006.01)
  *H01L 29/06* (2006.01)
  *H01L 21/02* (2006.01)
  *H01L 21/306* (2006.01)
  *H01L 21/326* (2006.01)
  *H01L 29/16* (2006.01)

(52) U.S. Cl.
  CPC ...... *H01L 21/306* (2013.01); *H01L 21/30604* (2013.01); *H01L 21/326* (2013.01); *H01L 29/16* (2013.01)

(56) References Cited

U.S. PATENT DOCUMENTS

| | | |
|---|---|---|
| 4,251,286 A | 2/1981 | Barnett |
| 4,493,939 A | 1/1985 | Blaske et al. |
| 4,842,699 A | 6/1989 | Hua et al. |
| 5,391,914 A | 2/1995 | Sullivan et al. |
| 5,824,561 A | 10/1998 | Kishi et al. |
| 5,837,929 A | 11/1998 | Adelman |
| 5,950,067 A | 9/1999 | Maegawa et al. |
| 6,278,231 B1 | 8/2001 | Iwasaki et al. |
| 6,300,150 B1 | 10/2001 | Venkatasubramanian |
| 6,843,902 B1 | 1/2005 | Penner et al. |
| 6,882,051 B2 | 4/2005 | Majumdar et al. |
| 6,894,215 B2 | 5/2005 | Akiba |
| 6,996,147 B2 | 2/2006 | Majumdar et al. |
| 7,267,859 B1 | 9/2007 | Rabin et al. |
| 7,361,313 B2 | 4/2008 | Chan et al. |
| 7,569,202 B2 | 8/2009 | Farrell et al. |
| 7,605,327 B2 | 10/2009 | Roscheisen et al. |
| 7,713,778 B2 | 5/2010 | Li et al. |
| 7,820,292 B2 | 10/2010 | Shcherbakov et al. |
| 8,044,294 B2 | 10/2011 | Park et al. |
| 8,206,780 B2 | 6/2012 | Li et al. |
| 8,729,381 B2 | 5/2014 | Yang et al. |
| 8,736,011 B2 | 5/2014 | Yi et al. |
| 9,051,175 B2 | 6/2015 | Matus et al. |
| 9,082,930 B1 | 7/2015 | Wacker et al. |
| 9,219,215 B1 | 12/2015 | Yang et al. |
| 9,240,328 B2 | 1/2016 | Yi et al. |
| 2002/0175408 A1 | 11/2002 | Majumdar et al. |
| 2003/0041892 A1 | 3/2003 | Fleurial et al. |
| 2003/0099279 A1 | 5/2003 | Venkatasubramanian et al. |
| 2003/0184188 A1 | 10/2003 | Kucherov et al. |
| 2003/0189202 A1 | 10/2003 | Li et al. |
| 2004/0000333 A1 | 1/2004 | Chen et al. |
| 2004/0042181 A1 | 3/2004 | Nagasaki |
| 2004/0106203 A1 | 6/2004 | Stasiak et al. |
| 2004/0157354 A1 | 8/2004 | Kuriyama et al. |
| 2004/0161369 A1 | 8/2004 | Chan et al. |
| 2004/0251539 A1 | 12/2004 | Faris et al. |
| 2004/0261830 A1 | 12/2004 | Sharp et al. |
| 2005/0045702 A1 | 3/2005 | Freeman et al. |
| 2005/0060884 A1 | 3/2005 | Okamura |
| 2005/0064185 A1 | 3/2005 | Buretea et al. |
| 2005/0110064 A1 | 5/2005 | Duan et al. |
| 2005/0112872 A1 | 5/2005 | Okamura |
| 2005/0224790 A1 | 10/2005 | Jin et al. |
| 2005/0241690 A1 | 11/2005 | Tajima et al. |
| 2006/0000502 A1 | 1/2006 | Fiorini et al. |
| 2006/0076046 A1 | 4/2006 | Ghoshal et al. |
| 2006/0118158 A1 | 6/2006 | Zhang et al. |
| 2006/0118513 A1 | 6/2006 | Faure et al. |
| 2006/0151820 A1 | 7/2006 | Duan et al. |
| 2006/0157101 A1 | 7/2006 | Sakamoto et al. |
| 2006/0159916 A1 | 7/2006 | Dubrow et al. |
| 2006/0172116 A1 | 8/2006 | Den et al. |
| 2006/0233692 A1 | 10/2006 | Scaringe et al. |
| 2006/0251561 A1 | 11/2006 | Farrell et al. |
| 2006/0254501 A1 | 11/2006 | Wang et al. |
| 2006/0266402 A1 | 11/2006 | Zhang et al. |
| 2007/0025658 A1 | 2/2007 | Fukai et al. |
| 2007/0128773 A1 | 6/2007 | Baskaran |
| 2007/0131269 A1 | 6/2007 | Dutta |
| 2007/0132043 A1 | 6/2007 | Bradley et al. |
| 2007/0261730 A1 | 11/2007 | Seker et al. |
| 2008/0006843 A1 | 1/2008 | Dai et al. |
| 2008/0060695 A1 | 3/2008 | Brignone |
| 2008/0093698 A1 | 4/2008 | Tsakalakos et al. |
| 2008/0121263 A1 | 5/2008 | Schutte et al. |
| 2008/0142066 A1 | 6/2008 | Plissonnier et al. |
| 2008/0149914 A1 | 6/2008 | Samuelson et al. |
| 2008/0173344 A1 | 7/2008 | Zhang et al. |
| 2008/0178920 A1 | 7/2008 | Ullo |
| 2008/0178921 A1 | 7/2008 | Ye |
| 2008/0230802 A1 | 9/2008 | Bakkers et al. |
| 2008/0268233 A1 | 10/2008 | Lawin et al. |
| 2008/0299381 A1 | 12/2008 | Zhang et al. |
| 2008/0308140 A1 | 12/2008 | Nakamura |
| 2009/0004086 A1 | 1/2009 | Kuhling et al. |
| 2009/0009756 A1 | 1/2009 | Yamamichi |
| 2009/0020148 A1 | 1/2009 | Boukai et al. |
| 2009/0096109 A1 | 4/2009 | Iwasaki |
| 2009/0117741 A1 | 5/2009 | Heath et al. |
| 2009/0140145 A1 | 6/2009 | Ouvrier-Buffet et al. |
| 2009/0174038 A1 | 7/2009 | Wang |
| 2009/0214848 A1 | 8/2009 | Sands |
| 2009/0236317 A1 | 9/2009 | Yost et al. |
| 2009/0256134 A1 | 10/2009 | Buchine et al. |
| 2010/0068871 A1 | 3/2010 | Tian et al. |
| 2010/0072461 A1 | 3/2010 | Hannebauer |
| 2010/0078055 A1 | 4/2010 | Vidu et al. |
| 2010/0147350 A1 | 6/2010 | Chou |
| 2010/0147371 A1 | 6/2010 | Cho |
| 2010/0162728 A1 | 7/2010 | Lee |
| 2010/0233518 A1 | 9/2010 | Kwon et al. |
| 2010/0236596 A1 | 9/2010 | Lee et al. |
| 2010/0261013 A1 | 10/2010 | Duan et al. |
| 2010/0272993 A1 | 10/2010 | Volinsky et al. |
| 2010/0319759 A1 | 12/2010 | Fisher et al. |
| 2011/0000708 A1 | 1/2011 | Nakai et al. |
| 2011/0059568 A1 | 3/2011 | Chao et al. |
| 2011/0065223 A1 | 3/2011 | Hannebauer |
| 2011/0114145 A1 | 5/2011 | Yang et al. |
| 2011/0114146 A1 | 5/2011 | Scullin |
| 2011/0163636 A1 | 7/2011 | Sirbuly et al. |
| 2011/0233512 A1 | 9/2011 | Yang et al. |
| 2011/0266521 A1 | 11/2011 | Ferrari et al. |
| 2011/0304004 A1 | 12/2011 | Park |
| 2012/0037591 A1 | 2/2012 | Tringe et al. |
| 2012/0040512 A1 | 2/2012 | Li et al. |
| 2012/0049315 A1 | 3/2012 | Kim et al. |
| 2012/0126449 A1 | 5/2012 | Hart et al. |
| 2012/0152295 A1 | 6/2012 | Matus et al. |
| 2012/0247527 A1 | 10/2012 | Scullin et al. |
| 2012/0282435 A1 | 11/2012 | Yang et al. |
| 2012/0295074 A1 | 11/2012 | Yi et al. |
| 2013/0000688 A1 | 1/2013 | Cho et al. |
| 2013/0019918 A1 | 1/2013 | Boukai et al. |
| 2013/0037070 A1 | 2/2013 | Narducci et al. |
| 2013/0042899 A1 | 2/2013 | Wirtz et al. |
| 2013/0069194 A1* | 3/2013 | Marinescu .............. G01J 5/046 257/467 |
| 2013/0081662 A1 | 4/2013 | Dibra |
| 2013/0161834 A1 | 6/2013 | Pan |
| 2013/0175654 A1 | 7/2013 | Muckenhirn et al. |
| 2013/0186445 A1 | 7/2013 | Lorimer et al. |
| 2013/0187130 A1 | 7/2013 | Matus et al. |
| 2013/0241026 A1 | 9/2013 | Or-Bach et al. |
| 2013/0267046 A1 | 10/2013 | Or-Bach et al. |
| 2014/0001562 A1* | 1/2014 | Liaw ................ H01L 21/82343 257/369 |
| 2014/0024163 A1 | 1/2014 | Aguirre et al. |
| 2014/0116491 A1 | 5/2014 | Reifenberg et al. |
| 2014/0182644 A1 | 7/2014 | Aguirre et al. |
| 2014/0193982 A1 | 7/2014 | Yi et al. |
| 2014/0318593 A1 | 10/2014 | Venkatasubramanian et al. |

(56) References Cited

U.S. PATENT DOCUMENTS

| | | | |
|---|---|---|---|
| 2014/0329389 | A1 | 11/2014 | Matus et al. |
| 2015/0009571 | A1* | 1/2015 | Chin .................. C25D 1/10 359/601 |

FOREIGN PATENT DOCUMENTS

| | | |
|---|---|---|
| CN | 101009214 | 8/2007 |
| CN | 101156255 | 4/2008 |
| CN | 101836285 | 9/2010 |
| EP | 0687020 | 12/1995 |
| EP | 1426756 | 6/2004 |
| JP | 2001-68746 | 3/2001 |
| JP | 2004-532133 | 10/2004 |
| JP | 2006-196727 | 7/2006 |
| JP | 2006-332188 | 12/2006 |
| JP | 2007-059647 | 3/2007 |
| JP | 2008-523614 | 7/2008 |
| JP | 2009-43783 | 2/2009 |
| JP | 2010-537430 | 12/2010 |
| JP | 5524839 | 4/2014 |
| RU | 2296055 | 11/2006 |
| WO | WO 00/08693 | 2/2000 |
| WO | WO 02/080280 | 10/2002 |
| WO | WO 2006/062582 | 6/2006 |
| WO | WO 2008/060282 | 5/2008 |
| WO | WO 2009/014985 | 1/2009 |
| WO | WO 2009/026466 | 2/2009 |
| WO | WO 2009/125317 | 10/2009 |
| WO | WO 2010/004550 | 1/2010 |
| WO | WO 2010/018893 | 2/2010 |
| WO | WO 2015/021467 | 2/2015 |

OTHER PUBLICATIONS

United States Patent and Trademark Office, Office Action issued in U.S. Appl. No. 13/430,558, mailed Jun. 29, 2015.
United States Patent and Trademark Office, Office Action issued in U.S. Appl. No. 12/943,134, mailed Sep. 25, 2015.
United States Patent and Trademark Office, Notice of Allowance issued in U.S. Appl. No. 13/299,179, mailed Sep. 23, 2015.
United States Patent and Trademark Office, Office Action issued in U.S. Appl. No. 13/331,768, mailed Oct. 6, 2015.
Asheghi et al., "Phonon-Boundary Scattering in Thin Silicon Layers," *Appl. Phys. Lett.*, 71(13) (1997), 1798-1800.
Asheghi et al., "Temperature-Dependent Thermal Conductivity of Single Crystal Silicon Layers in SOI Substrates," *J. Heat Transf.*, 120 (1998), pp. 30-36.
Bell, "Cooling, heating, generating power, and recovering waste heat with thermoelectric systems," *Science*, vol. 321. pp. 1457-1461, Sep. 12, 2008.
Ben-Chorin et al., "Hopping transport on a fractal: ac conductivity of porous silicon," *Physical Review B*, vol. 51, No. 4, pp. 2199-2213, Jan. 15, 1995.
Benecke et al., "MEMS Applications of Porous Silicon," Proc. SPIE 4592, Device and Process Technologies for MEMS and Microelectronics II, 76: doi:10.1117/12.449009, 12 pages (Nov. 21, 2011).
Bogush et al., "Preparation of monodisperse silica particles: Control of size and mass fraction," Journal of Non-Crystalline Solids 104: 95-106 (1988).
Boukai et al, "Silicon nanowires as efficient thermoelectric materials," Nature, vol. 451, Jan. 10, 2000.
Brinson et al., "Thermal Conductivity and Thermoelectric Power of Heavily Doped N-Type Silicon," *J. Phys. C*, 3 (1970), pp. 483-491.
Bux et al., "Nanostructured bulk silicon as an effective thermoelectric material," Advanced Functional Materials 2009, 19, 2445-2452.
Cahill et al., "Lower limit to the thermal conductivity of disordered crystals," Physical Review B, vol. 46, No. 10, pp. 6131-6140, Sep. 1, 1992.
Cahill et al., "Thermal Conductivity of Amorphous Solids Above the Plateau," *Phys. Rev. B*, 35 (1987) pp. 4067-4073.

Chartier et al., "Metal-Assisted Chemical Etching of Silcon in HF-$H_2O_2$," *Electrochmica Acta*, 53 (2008) pp. 5509-5516.
Chen et al., "Wafer-scale synthesis of single-crystal zigzag silicon nanowire arrays with controlled turning angles," Nano Lett. 10: 864-868 (2010).
Chen et al., "Thermal Conductance of Thin Silicon Nanowires," *Physical Review Letters*, 101 (2008) pp. 105501-1-105501-4.
Chen et al., "Vertically-Aligned of Sub-Millimeter Ultralong Si Nanowire Arrays and Its Reduced Phonon Thermal Conductivity," *Journal of The Electrochemical Society*, 158:5 (2011) pp. D302-D306.
Cheng et al., "Fabrication of Vertically Aligned Silicon Nanowire Arrays and Investigation on the Formation of the Nickel Silicide Nanowires," presented at the 2007 IEEE Conference on Electron Devices and Solid-State Circuit held Dec. 20-22, 2007, *IEEE Service Center*, 2007, pp. 121-124.
Chiappini et al., "Biodegradable porous silicon barcode nanowires with defined geometry," Adv. Funct. Mater. 20: 2231-2239 (2010).
Chiritescu et al., "Ultralow thermal conductivity in disordered, layered $WSe_2$ crystals," Science, vol. 315, pp. 351-353, Jan. 19, 2007.
Cui, "High performance silicon nanowire field effect transistors," Nano Letters, 2003, vol. 3, No. 2 pp. 149-152, Nov. 1, 2002.
Disalvo, F.J., "Thermoelectric Cooling and Power Generation," *Science*, 285 (1999), 703-706.
Douani et al., "Formation of a-Si:H and a-$Si_{1-x}C_x$:H Nanowires by Ag-Assisted Electroless Etching in Aqueous HF/$AgNO_3$ Solution," *Thin Solid Films*, 519 (2011) pp. 5383-5387.
Electron Microscopy Sciences, Colloidal Compounds and Conductive Adhesives, Jan. 25, 2011 (Jan. 25, 2011): Retrieved on Aug. 13, 2012 from the Internet <URL: http://web.archive.org/web/20110125172854/http://emsdiasum.com/microscopy/products/sem/colloidal.aspx>, pp. 1-16.
Engineering Toolbox, "Thermal Conductivity of Metals," Engineering ToolBox.com [retrieved online on Jan. 22, 2014], from the Internet <URL: http://www.engineeringtoolbox.com/thermal-conductivity-metals-d_858.html>, pp. 1-8.
Evanoff et al., "Synthesis and Optical Properties of Silver Nanoparticles and Arrays," *ChemPhysChem*, 6 (2005) pp. 1221-1231.
Fang et al., "Silver Catalysis in the Fabrication of Silicon Nanowire Arrays," *Nanotechnology*, 17 (2006) pp. 3768-3774.
Gao et al., "Selective Growth of Si Nanowire Arrays via Galvanic Displacement Processes in Water-in-Oil Microemulsions," *J. Am. Chem. Soc.*, 127 (2005) pp. 4574-4575.
Geballe et al., "Seebeck Effect in Silicon," *Phys. Rev.*, 98(4) (1955), pp. 940-947.
Gesele et al., "Temperature-dependent thermal conductivity of porous silicon," J. Phys. D: Appl. Phys. 30 (1997) 2911-2916, May 19, 1997.
Gielis et al., "Silver-Assisted Electroless Etching of Si Nanowires," Abstract #1971, presented Oct. 11, 2010 at the $218^{th}$ ECS Meeting (held in Las Vegas, NV, Oct. 10-15, 2010).
Haick et al., "Electrical characteristics and chemical stability of non-oxidized, methyl-terminated silicon nanowires," J. Am. Chem. Soc. 2006, 128, 8990-8991, Oct. 4, 2005.
Hao et al., "Frequency-dependent Monte Carlo simulations of phonon transport in two-dimensional porous silicon with aligned pores," Journal of Applied Physics 106, 114321 (2009), Dec. 15, 2009.
Harman et al., "Quantum Dot Superlattice Thermoelectric Materials and Evices," *Science*, 297 (2002), pp. 2229-2232.
Heitsch et al., *J. Am. Chem. Soc.*, 130 (2008) pp. 5436-5437.
Hochbaum et al., "Controlled Growth of Si Nanowire Arrays for Device Integration," *Nano Letters*, 5(3) (2005) pp. 457-460.
Hochbaum et al., "Enhanced Thermoelectric Performance of Rough Silicon Nanowires," Nature, 451 (2008) pp. 163-167 (with full Methods attached from on-line version of this paper at www.nature.com/nature).
Hochbaum et al., "Single Crystalline Mesoporous Silicon Nanowires," *Nano Letters*, 9(10) (2009) pp. 3550-3554.
Hsu et al., "Cubic $AgPb_mSbTe_{2+m}$: Bulk Thermoelectric Materials with High Figure of Merit," *Science*, 303 (2004), pp. 818-821.

(56) References Cited

OTHER PUBLICATIONS

Huang et al., "Metal-assisted chemical etching of silicon: A review," Adv. Mater. 23: 285-308 (2011).
Huang et al., "Oxidation rate effect on the direction of metal-assisted chemical and electrochemical etching of silicon," J. Phys. Chem. C 114: 10683-10690 (2010).
Huang et al., "Synthesis of uniform, spherical sub-100 nm silica particles using a conceptual modification of the classic LaMer model," Colloids and Surfaces A: Physicochem. Eng. Aspects 360: 175-183 (2010).
Infineon, "Introduction to Power Dissipation and Thermal Resistance," Infineon.com [retrieved online on Jan. 22, 2014], from the Internet <URL: http://www.btipnow.com/events/ppt/Ch4%20Intro%20Power%20Diss%20Thermal%20Res.ppt>, pp. 1-67.
Ju et al., "Phonon Scattering in Silicon Films with Thickness of Order 100 nm," Appl. Phys. Lett., 74(20) (1999), pp. 3005-3007.
Kim et al.. "Curved silicon nanowires with ribbon-like cross sections by metal-assisted chemical etching," ACS Nano 5(6): 5242-5248 (2011).
Kim et al., "Thermal Conductivity Reduction and Thermoelectric Figure of Merit Increase by Embedding Nanoparticles in Crystalline Semiconductors," Phys. Rev. Lett., 96 (2006), pp. 045901-1-045901-4.
Kim et al., "Thermal Transport Properties of Thin Films of Small Molecule Organic Semiconductors," Applied Physics Letters, 87: 241908 (2005), 3 pages.
Kolasinski, Kurt W., "Silicon Nanostructures from Electroless Electrochemical Etching," Current Opinion in Solid State and Materials Science, 9(1-2), (2005), pp. 73-83.
Lee et al., "Scalable nanopillar arrays with layer-by-layer patterned overt and covert images," Adv. Mater. 26: 6119-6124 (2014).
Li et al., "Thermal Conductivity of Individual Silicon Nanowires," Appl. Phys. Lett., 83(141 (2003), pp. 2934-2936.
Majumdar, A., "Lower limit of thermal conductivity: diffusion versus localization," Technical Discussion, Microscale Thermophysical Engineering, 2:5-9, 1998, © 1998 Taylor & Francis 1089-3954/98.
Majumdar, A., "Thermoelectricity in Semiconductor Nanostructures," Science, 303 (2004), pp. 777-778.
Masetti et al., "Modeling of Carrier Mobility Against Carrier Concentration in Arsenic-, Phosphorus-, and Boron-Doped Silicon," IEEE Transactions on Electron Device, 30(7):764-769 (1983).
Mathur et al., "Thermoelectric power in porous silicon," Journal of Applied Physics, vol. 83, No. 11, pp. 5855-5857, Jun. 1, 1998.
Morinaga et al., "Mechanism of Metallic Particle Growth and Metal-Induced Pitting on Si Wafer Surface in Wet Chemical Process," J. Electrochem. Soc., 141(10) (1994) pp. 2834-2841.
Nahm et al., "Mechanism of Silicon Etching in $HF-KMnO_4-H_2O$ Solution," Korean J. of Chem. Eng., 12(2) (1995) pp. 162-167.
Park et al., "Fabrication of highly ordered silicon oxide dots and stripes from block copolymer thin films," Advanced Materials 2008, 20, 681-685.
Parkhutik, V.P., "Oscillations of Open-Circuit Potential During Immersion Plating of Silicon in $CuSo_4$/HF Solutions," Russian Journal of Electrochemistry, 42(5) (2006) pp. 512-522.
Peng et al., "Aligned Single-Crystalline Si Nanowire Arrays for Photovoltaic Applications," Small, 1(11), (2005), pp. 1062-1067.
Peng et al., "Aligned Single-Crystalline Si Nanowire Arrays for Photovoltaic Applications," Small, 1(11), (2005), pp. 1062-1067, with three additional pages of "Supporting Information."
Peng et al., "Fabrication of single-crystalline silicon nanowires by scratching a silicon surface with catalytic metal particles," Adv. Funct. Mater. 16: 387-394 (2006).
Peng et al., "Dendrite-Assisted Growth of Silicon Nanowires in Electroless Metal Deposition," Advanced Functional Materials, 13(2) (2003) pp. 127-132.
Peng et al., "Motility of Metal Nanoparticles in Silicon and Induced Anisotropic Silicon Etching," Advanced Functional Materials, 18 (2008) pp. 3026-3035.

Peng et al., "Synthesis of Large-Area Silicon Nanowire Arrays via Self-Assembling Nanoelectrochemistry," Adv. Mater., 14(16) (2002) pp. 1164-1167.
Peng et al., "Uniform, Axial-Orientation Alignment of One-Dimensional Single-Crystal Silicon Nanostructure Arrays," Angew. Chem. Int. Ed., 44 (2005) pp. 2737-2742.
Rokugawa et al., "An Etchant System, $Ag_2CrO_4-HF-H_2O$, for Highly Aligned Si Nanowire Fabrication," Journal of The Electrochemical Society, 157(8) (2010), pp. K157-K161.
Rue et al., "Thermal Conductivity of Isotopically Enriched Silicon," Solid State Commun., 115 (2000), pp. 243-247.
Rutten et al., "The Electrochemical Reduction of Nitrate in Acidic Nitrate Solutions," Journal of Applied Electrochemistry, 29 (1999) pp. 87-92.
Ryckman et al., "Direct imprinting of porous substrates: A rapid and low-cost approach for patterning porous nanomaterials," Nano Lett.: dx.doi/10.1021/n11028073, 6 pages (2010).
Sailor, "Fundamentals of Porous Silicon Preparation," Chapter 1, pp. 1-42, Porous Silicon in Practice: Preparation, Characterization and Applications, First Edition, Wiley-VCH Verlag GmbH & Co. KGaA (2012).
Shi et al., "Measuring Thermal and Thermoelectric Properties of One-Dimensional Nanostructures Using a Microfabricated Device," J. Heat Transf., 125 (2003), pp. 881-888.
Sivakov et al., "Realization of Vertical and Zigzag Single Crystalline Silicon Nanowire Architectures," J. Phys. Chem. C, 114 (2010) pp. 3798-3803.
Snyder et al., "Complex thermoelectric materials," Nature Materials, vol. 7, pp. 105-112, Feb. 2008.
Stewart et al., "Nanostructured Plasmonic Sensors," Chem. Rev. 108:494-521 (2008).
Stober et al., "Controlled growth of monodisperse silica spheres in the micron size range," Journal of Colloid and Interface Science 26: 62-69 (1968).
Swartz et al., "Thermal boundary resistance," Reviews of Modern Physics, vol. 61, No. 3, pp. 605-668, Jul. 1989.
Tang et al., "Holey Silicon as an Efficient Thermoelectric Material JIB-2854," abstract, Lawrence Berkeley National Laboratory, Apr. 8, 2011. Downloaded from http://lbl.gov.Tech-Transfer/techs/Ibn12854.html on Apr. 14, 2011 (one page).
Tang et al., "Holey Silicon as an Efficient Thermoelectric Material," Nano Lett., 10 (2010) pp. 4279-4283.
Tao et al., "Langmuir-Blodgett Silver Nanowire Monolayers for Molecular Sensing Using Surface-Enhanced Raman Spectroscopy," Nano. Lett. 3, (2003), pp. 1229-1233.
Tritt et al., "Thermoelectrics: Direct solar thermal energy conversion," MRS Bulletin, vol. 33, Apr. 2008.
Van Herwaarden, A.W., "The Seebeck Effect in Silicon ICs.," Sensors and Actuators, 6 (1984), pp. 245-254.
Vazquez-Mena et al., "Metallic nanowires by full wafer stencil lithography," Nano Letters, 2008, vol. 8, No. 11, 3675-3682, Aug. 11, 2008.
Venkatasubramanian et al., "Thin-film Thermoelectric Devices with High Room-Temperature Figures of Merit," Nature, 413 (2001), pp. 597-602.
Wang et al., "A New Type of Low Power Thermoelectric Micro-Generator Fabricated by Nanowire Array Thermoelectric Material," Microelectronic Engineering, 77(3-4): 223-229 (Apr. 1, 2005).
Wang et al., "Complementary Symmetry Silicon Nanowire Logic: Power-Efficient Inverters with Gain," Small, 2(10), (2006), pp. 1153-1158.
Weber et al., "Transport Properties of Silicon," Appl. Phys. A. 53, (1991), 136-140.
Weiss et al., "Nanoparticle-Textured Surfaces from Spin Coating," Langmuir, 24 (2008) pp. 5218-5220.
Wilson, "Thermal Conductivity of Solders," Electronics-cooling.com [retrieved online on Jan. 23, 2014], from the Internet <URL: http://www.electronics-cooling.com/2006/08/thermal-conductivity-of-solders/>, pp. 1-3.
Yamamoto et al., "Thermoelectric transport properties of porous silicon nanostructure," 18th International Conference on Thermoelectrics (1999), © 2000 IEEE 0-7803-5451-6/00.

(56) References Cited

OTHER PUBLICATIONS

Yang et al., "Thermoelectric materials for space and automotive power generation," MRS Bulletin, vol. 31, pp. 224-229, Mar. 2006.
Yoo et al., "Thermal Conductivity of Al2O3/Water Nanofluids," *Journal of the Korean Physical Society*, 51 (Oct. 2007), pp. S84-S87.
Zandi et al., "Study of Bulk Micromachining for <100> Silicon," *Eur. Phys. J. Appl. Phys.*, 35 (2006) pp. 7-12.
Zhang et al., "Synthesis of Ordered Single Crystal Silicon Nanowire Arrays," *Adv. Mater.*, 13 (2001), 1238-1241.
Zou et al., "Phonon Heat Conduction in a Semiconductor Nanowire," *J. App. Phys.*, 89(5) (2001) pp. 2932-2938.
Chinese Patent Office, Office Action in CN Application No. 200880113050.3, mailed Aug. 26, 2013.
Chinese Patent Office, Office Action in CN Application No. 200880113050.3, mailed Mar. 5, 2013.
Chinese Patent Office, Office Action in CN Application No. 200880113050.3, mailed Oct. 24, 2011.
Chinese Patent Office, Office Action in CN Application No. 200880113050.3, mailed Sep. 5, 2012.
Chinese Patent Office, Office Action issued in Application No. 201180066221.3 mailed May 5, 2015.
European Patent Office, Extended European Search Report for EP Application No. 11845164.0, mailed Nov. 6, 2014.
European Patent Office, Extended European Search Report for EP Application No. 11841453.1, mailed Nov. 28, 2014.
European Patent Office, Extended European Search Report for EP Application No. 10830715.8, mailed Jun. 10, 2014.
European Patent Office, Supplemental Search Report for EP Application No. 08827590, mailed Aug. 5, 2013.
European Patent Office, Supplemental Search Report for EP Application No. 10163141, mailed Aug. 20, 2013.
Japanese Patent Office, Office Action in JP Application No. 2010-522040, mailed Mar. 5, 2013.
Japanese Patent Office, Office Action in JP Application No. 2010-522040, mailed Oct. 15, 2013.
Patent Cooperation Treaty, International Search Report for application PCT/US2010/056356, mailed Jun. 3, 2011.
Patent Cooperation Treaty, Written Opinion of the International Searching Authority for application PCT/US2010/056356, mailed Jun. 3, 2011.
Patent Cooperation Treaty, International Search Report for application PCT/US2011/061301, mailed Jan. 31, 2013.
Patent Cooperation Treaty, Written Opinion of the International Searching Authority for application PCT/US2011/061301, mailed Jan. 31, 2013.
Patent Cooperation Treaty, International Search Report for application PCT/US2011/63000, mailed Apr. 3, 2012.
Patent Cooperation Treaty, Written Opinion of the International Searching Authority for application PCT/US2011/63000, mailed Apr. 3, 2012.
Patent Cooperation Treaty, International Search Report for application PCT/US2011/066108, mailed Apr. 26, 2012.
Patent Cooperation Treaty, Written Opinion of the International Searching Authority for application PCT/US2011/066108, mailed Apr. 26, 2012.
Patent Cooperation Treaty, International Search Report for application PCT/US2012/023425, mailed Sep. 4, 2012.
Patent Cooperation Treaty, Written Opinion of the International Searching Authority for application PCT/US2012/023425, mailed Sep. 4, 2012.
Patent Cooperation Treaty, International Search Report for application PCT/US2013/025060, mailed Apr. 15, 2013.
Patent Cooperation Treaty, Written Opinion of the International Searching Authority for application PCT/US2013/025060, mailed Apr. 15, 2013.
Patent Cooperation Treaty, International Search Report for PCT/US08/73922, mailed Dec. 23, 2008.
Patent Cooperation Treaty, Written Opinion for PCT/US08/73922, mailed Dec. 23, 2008.
Russian Patent Office, Office Action in RU Application No. 2010110307/04, mailed Jun. 1, 2012.
Russian Patent Office, Resolution on Granting Patent for Invention in RU Application No. 2010110307/04, mailed Sep. 11, 2013.
United States Patent and Trademark Office, Office Action issued in U.S. Appl. No. 13/430,558, mailed Apr. 24, 2014.
United States Patent and Trademark Office, Office Action issued in U.S. Appl. No. 13/430,558, mailed Jan. 30, 2015.
United States Patent and Trademark Office, Office Action issued in U.S. Appl. No. 12/943,134, mailed Nov. 18, 2013.
United States Patent and Trademark Office, Office Action issued in U.S. Appl. No. 12/943,134, mailed May 22, 2014.
United States Patent and Trademark Office, Office Action issued in U.S. Appl. No. 12/943,134, mailed Jan. 21, 2015.
United States Patent and Trademark Office, Office Action issued in U.S. Appl. No. 13/299,179, mailed Feb. 26, 2015.
United States Patent and Trademark Office, Office Action issued in U.S. Appl. No. 13/331,768, mailed Jan. 20, 2015.
United States Patent and Trademark Office, Office Action issued in U.S. Appl. No. 13/364,176, mailed Jan. 27, 2014.
United States Patent and Trademark Office, Office Action issued in U.S. Appl. No. 13/364,176, mailed Sep. 8, 2014.
United States Patent and Trademark Office, Office Action issued in U.S. Appl. No. 13/364,176, mailed Apr. 29, 2015.
United States Patent and Trademark Office, Office Action issued in U.S. Appl. No. 13/760,977, mailed Apr. 1, 2014.
United States Patent and Trademark Office, Office Action issued in U.S. Appl. No. 13/760,977, mailed Dec. 2, 2014.
United States Patent and Trademark Office, Office Action issued in U.S. Appl. No. 13/947,400, mailed Oct. 3, 2014.
United States Patent and Trademark Office, Notice of Allowance issued in U.S. Appl. No. 13/947,400, mailed Mar. 24, 2015.
United States Patent and Trademark Office, Notice of Allowance issued in U.S. Appl. No. 13/786,090, mailed Oct. 9, 2014.
United States Patent and Trademark Office, Notice of Allowance issued in U.S. Appl. No. 13/786,090, mailed Feb. 9, 2015.
United States Patent and Trademark Office, Corrected Notice of Allowability issued in U.S. Appl. No. 13/786,090, mailed Mar. 3, 2015.
United States Patent and Trademark Office, Notice of Allowance issued in U.S. Appl. No. 14/059,362, mailed Jan. 8, 2015.
United States Patent and Trademark Office, Notice of Allowance issued in U.S. Appl. No. 14/059,362, mailed Mar. 6, 2015.
United States Patent and Trademark Office, Office Action issued in U.S. Appl. No. 14/203,360, mailed Jun. 10, 2014.
United States Patent and Trademark Office, Notice of Allowance issued in U.S. Appl. No. 14/203,360, mailed Sep. 18, 2014.
United States Patent and Trademark Office, Office Action issued in U.S. Appl. No. 14/203,360, mailed Jan. 26, 2015.
United States Patent and Trademark Office, Notice of Allowance issued in U.S. Appl. No. 14/333,197, mailed May 1, 2015.
United States Patent and Trademark Office, Office Action issued in U.S. Appl. No. 14/226,569, mailed Jun. 8, 2015.
United States Patent and Trademark Office, Office Action issued in U.S. Appl. No. 13/760,977, mailed Jun. 17, 2015.
Chinese Patent Office, Office Action in CN Application No. 201180065569.0, mailed Aug. 3, 2015.
Patent Cooperation Treaty, International Search Report for application PCT/US2015/025075, mailed Aug. 4, 2015.
Patent Cooperation Treaty, Written Opinion of the International Searching Authority for application PCT/US2015/025075, mailed Aug. 4, 2015.
United States Patent and Trademark Office, Notice of Allowance issued in U.S. Appl. No. 13/947,400, mailed Jul. 6, 2015.
United States Patent and Trademark Office, Notice of Allowance issued in U.S. Appl. No. 14/203,360, mailed Jul. 21, 2015.
United States Patent and Trademark Office, Notice of Allowance issued in U.S. Appl. No. 14/333,197, mailed Aug. 18, 2015.
Chinese Patent Office, Office Action issued in Application No. 201180066221.3 mailed Jan. 11, 2016.
Chinese Patent Office, Office Action issued in Application No. 201280016754.5 mailed Sep. 6, 2015.

(56) References Cited

OTHER PUBLICATIONS

European Patent Office, Office Action Issued for EP Application No. 11841453.1, mailed Oct. 9, 2015.
Japanese Patent Office, Office Action in JP Application No. 2013-540036, mailed Jan. 26, 2016.
Japanese Patent Office, Office Action issued in Application No. 2013-542193 mailed Mar. 22, 2016.
Japanese Patent Office, Office Action issued in Application No. 2013-552585 mailed Apr. 26, 2016.
United States Patent and Trademark Office, Final Office Action issued in U.S. Appl. No. 13/430,558, mailed Jan. 30, 2015.
United States Patent and Trademark Office, Notice of Allowance issued in U.S. Appl. No. 14/203,360, mailed Oct. 26, 2015.
United States Patent and Trademark Office, Notice of Allowance issued in U.S. Appl. No. 14/203,360, mailed May 4, 2016.
United States Patent and Trademark Office, Office Action issued in U.S. Appl. No. 13/430,558, mailed Mar. 8, 2016.
United States Patent and Trademark Office, Office Action issued in U.S. Appl. No. 13/364,176, mailed Oct. 20, 2015.
United States Patent and Trademark Office, Office Action issued in U.S. Appl. No. 13/760,977, mailed Mar. 25, 2016.
United States Patent and Trademark Office, Office Action issued in U.S. Appl. No. 14/567,813, mailed Feb. 16, 2016.

* cited by examiner

ULTRA-LONG SILICON NANOSTRUCTURES, AND METHODS OF FORMING AND TRANSFERRING THE SAME

CROSS-REFERENCE TO RELATED APPLICATION

This application claims the benefit of U.S. Provisional Patent Application No. 61/978,026, filed Apr. 10, 2014 and entitled "Formation and Transfer of Ultra-Long Silicon Nanowires," the entire contents of which are incorporated by reference herein for all purposes.

FIELD

The present invention is directed to semiconductor manufacturing technology. More particularly, the invention provides a method for forming and transferring ultra-long silicon nanostructures, such as nanowires. Merely by way of an example, an external current is applied to replace a solution oxidizer for forming silicon nanostructure, e.g., nanowire, arrays with a relatively uniform rate and relatively controlled properties up to lengths near a whole silicon wafer thickness and current adjustments and/or solution adjustments are applied for causing the formation of porosity in the silicon nanostructures, e.g., nanowires, and for facilitating transfer of these silicon nanostructures, e.g., nanowires for the manufacturing of a thermoelectric module. It would be recognized that the invention has a much broader range of applicability.

BACKGROUND

Thermoelectric materials can convert an appreciable amount of thermal energy into electricity in an applied temperature gradient (e.g., the Seebeck effect) or pump heat in an applied electric field (e.g., the Peltier effect), in the solid state and with no moving parts. The applications for solid-state heat engines are numerous, including the generation of electricity from various heat sources whether primary or waste, as well as the cooling of spaces or objects such as microchips and sensors. Interest in the use of thermoelectric materials that comprise thermoelectric devices has grown in recent years in part due to advances in nano-structured materials with enhanced thermoelectric performance (e.g., efficiency, power density, or "thermoelectric figure of merit" ZT, where ZT is equal to $S^2\sigma/k$ and S is the Seebeck coefficient, $\sigma$ the electrical conductivity, and k the thermal conductivity of the thermoelectric material) and also due to the heightened need for systems that either convert waste heat to electricity to improve energy efficiency or cool integrated circuits to improve their performance.

To date, thermoelectrics have had limited commercial applicability due to the relatively poor cost performance of these devices compared to other technologies that accomplish similar means of energy generation or refrigeration. Where other technologies usually are not as suitable as thermoelectrics for use in lightweight and low footprint applications, thermoelectrics often have nonetheless been limited by their prohibitively high costs. The manufacturability of thermoelectric devices and modules is important in realizing the usefulness of thermoelectrics in commercial applications. These modules are preferably produced in such a way that ensures, for example, maximum performance at minimum cost.

The thermoelectric materials in presently available commercial thermoelectric modules generally include, or are comprised of, bismuth telluride or lead telluride, which are both toxic, difficult to manufacture, and expensive to procure and process. With a strong present need for both alternative energy production and microscale cooling capabilities, the driving force for highly manufacturable, low cost, high performance thermoelectrics is growing. However, many drawbacks may exist in the production of conventional thermoelectric devices.

Nanostructures have shown promise for improving thermoelectric performance. Nanostructures often refer to structures that have at least one structural dimension measured on the nanoscale (e.g., between 0.1 nm and 1000 nm). For example, a nanowire is characterized as having a cross-sectional diameter that is measured on the nanoscale, even though the nanowire may be considerably longer in length. The creation of 0D, 1D, or 2D nanostructures from a thermoelectric material may improve the thermoelectric power generation or cooling efficiency of that material in some instances, and sometimes very significantly (a factor of 100 or greater) in other instances. However, many limitations exist in terms of formation and handling of the nanostructured materials needed for making an actual macroscopic thermoelectric device. The ability to process nanostructures associated with a common semiconductor material like silicon would have tremendous cost advantages for making large scale application possible for thermoelectrics.

SUMMARY

It is highly desirable to form ultra-long silicon nanowires (SiNWs) with uniform and controlled properties for thermoelectric materials. Promising thermoelectric results have been previously demonstrated when SiNWs are etched from bulk silicon, due to the etching mechanism significantly reducing the thermal conductivity without significantly impacting the electrical properties of the silicon nanowires. A promising technique to form SiNWs with beneficial thermoelectric properties is known as Metal-Assisted Chemical Etching or MACE. The formation of SiNWs using MACE is typically achieved by depositing a catalyst (Ag, Au, Pt, Pd, Fe, etc) either with metal salts (AgNO$_3$, KAuCl$_4$, etc) or depositing metal over a template on a Si wafer. Once the Si wafer is introduced into a solution containing an oxidizer (H$_2$O$_2$, HNO$_3$, NO$_3^-$, etc) and hydrofluoric acid (HF), the catalyst serves to oxidize the Si in contact with the catalyst by reducing the oxidizing solution at the etch front. The HF removes the oxidized Si, allowing the metal catalyst to move down into the Si. This process will continue to form SiNWs in the shape of the non-pattered areas until the Si wafer is removed from the etch bath.

Although metal-assisted chemical etching (MACE) works relatively well to form silicon nanowires (SiNWs), it has major drawbacks resulting from a chemical diffusion gradient of the solution oxidizer from the bulk solution to the etch front as the SiNW base and continuous etching of the silicon beyond the base of the SiNW array. The use of the solution oxidizer results in six significant issues: (1) nonlinear etch rates that can be caused by the solution oxidation at the etch front; (2) limited length that can be caused by reduced etch rates; (3) gradients in the SiNW morphology in the axial direction which can be caused by varying etch rates, which can result in non-uniform materials properties within an individual SiNW; (4) variable stress and decomposition of the etch catalyst, which can lead to premature catalyst breakdown; (5) continuous and undesirable SiNW sidewall etching that can be caused by constant contact with the solution oxidant; and (6) extensive SiNW tip etching that can cause a decrease in the SiNW length and additional challenge of electrically contacting or utilizing a heavily etched silicon feature. The above issues can make it a significant challenge to etch large area, highly dense, long and uniform SiNWs as a promising thermoelectric material.

Hence, it is desirable to improve techniques for the formation of large quantity of ultra-long silicon nanostructures, such as silicon nanowires (SiNWs). It is also desirable to form these ultra-long silicon nanostructures, e.g., SiNWs, with relatively uniform properties and to provide for a controlled transfer of the nanostructures, e.g., SiNWs from the bulk silicon wafer chucks without relying on mechanical forces that otherwise potentially fracture the nanostructures, e.g., SiNWs, and be detrimental to their thermoelectric performance. Depending upon the embodiment, one or more benefits may be achieved. These benefits and various additional objects, features, and advantages of the present invention can be fully appreciated with reference to the detailed description and accompanying drawings that follow.

In some embodiments, the invention provides a method for forming controlled and uniform silicon nanostructure, e.g., silicon nanowire (SiNW), arrays that are relatively consistent from wafer to wafer, relatively uniform across a wafer, and relatively uniform along the axial (length) direction of the SiNWs. Further, using certain embodiments of the method, ultra-long silicon nanostructures, e.g., SiNWs, can be formed with their lengths limited only by the original wafer starting thickness and not by any chemical depletion or gradients. Additionally, the method includes a process for performing controlled chemical removal or partial weakening of the silicon nanostructures, e.g., SiNWs, at a desired location for the immediate or future separation of the silicon nanostructures, e.g., SiNWs, from the bulk silicon substrate.

Under one aspect, a plurality of silicon nanostructures is provided. Each of the silicon nanostructures includes a length and a cross-section, the cross-section being substantially constant along the length, the length being at least 100 microns.

In some embodiments, the length is at least 250 microns. In some embodiments, the length is at least 500 microns.

In some embodiments, the cross-section is substantially rectangular. For example, the substantially rectangular cross-section can be elongated, and the nanostructures can include nanoribbons.

In some embodiments, the cross-section is substantially curved. For example, the cross-section can be substantially circular, or can be substantially annular.

In some embodiments, the cross-section varies by less than 50% along the length. For example, the cross-section can vary by less than 30% along the length. Or, for example, the cross section can vary by less than 20% along the length. Or, for example, the cross section can vary by less than 10% along the length. Or, for example, the cross section can vary by less than 5% along the length.

Under another aspect, a method of making nanostructures is provided that includes providing a silicon wafer including a thickness and first and second surfaces separated from one another by the thickness; forming a patterned layer of metal on the first surface of the silicon wafer; generating a current through the thickness of the silicon wafer, the metal oxidizing the silicon wafer in a region beneath the patterned layer of the metal; and exposing the silicon wafer to an etchant in the presence of the current, the etchant removing the oxidized region of the silicon wafer so as to define a plurality of nanostructures.

In some embodiments, each of the silicon nanostructures includes a length of least 100 microns. In some embodiments, each of the silicon nanostructures includes a length of least 250 microns. In some embodiments, each of the silicon nanostructures includes a length of least 500 microns.

In some embodiments, the current flows in a direction that is substantially perpendicular to the first and second surfaces.

In some embodiments, the method includes generating the current with first and second electrodes.

In some embodiments, the method includes generating the current by illuminating the silicon wafer with light.

In some embodiments, the patterned layer of metal defines a plurality of rectangularly shaped apertures, and the nanostructures include rectangularly shaped cross-sections substantially corresponding to the plurality of rectangularly shaped apertures. For example, the rectangularly shaped apertures can be elongated, and the nanostructures can include nanoribbons.

In some embodiments, the patterned layer of metal defines a plurality of curved apertures, and the nanostructures include curved cross sections substantially corresponding to the plurality of circularly shaped apertures. For example, the plurality of curved apertures can include circles.

Under another aspect, a method of transferring nanowires is provided that includes providing a plurality of nanostructures coupled to a silicon wafer, each nanowire including a length and a cross-sectional area; generating a current along the lengths of the nanowires; and exposing the nanowires and the silicon wafer to an etchant in the presence of a current, the etchant weakening the coupling between the nanowires and the silicon wafer.

In some embodiments, each of the silicon nanostructures includes a length of least 100 microns. In some embodiments, each of the silicon nanostructures includes a length of least 250 microns. In some embodiments, each of the silicon nanostructures includes a length of least 500 microns.

BRIEF DESCRIPTION OF DRAWINGS

FIGS. 5A-5C are SEM images of silicon nanostructures, e.g., SiNWs, etched and removed from Si substrate according to a specific embodiment of the present invention.

DETAILED DESCRIPTION

The present invention is directed to semiconductor manufacturing technology. More particularly, the invention provides a method for forming and transferring ultra-long silicon nanostructures, such as nanowires. Merely by way of an example, an external current is applied to replace a solution oxidizer for forming silicon nanostructure, e.g., nanowire, arrays with a relatively uniform rate and relatively controlled properties up to lengths near a whole silicon wafer thickness and current adjustments and/or solution adjustments are applied for causing the formation of porosity in the silicon nanostructures, e.g., nanowires, and for facilitating transfer of these silicon nanostructures, e.g., nanowires for the manufacturing of a thermoelectric module. It would be recognized that the invention has a much broader range of applicability.

Embodiments of the present invention provides a modified metal-assisted chemical etch (MACE) technique, referred to herein as current-induced MACE, to form silicon nanostructures, e.g., silicon nanowires (SiNWs), by replacing or supplementing the solution oxidant with an applied or induced current source. In an embodiment, using an externally applied current instead of, or in addition to, a solution oxidizer allows the formation of silicon nanostructures, e.g., SiNWs, with relatively uniform and relatively consistent properties both across the wafer and along the axial (length) direction of the silicon nanostructures, e.g., SiNWs, up to lengths nearly equal to the thickness of the wafer. The applied current, which can be relatively constant, results in a relatively stable etch rate throughout the etching process, thus facilitating the formation of ultra-long silicon nanostructures, e.g., SiNWs, and relatively uniform morphology along the axial (length) direction of the silicon nanostructures, e.g., SiNWs, with a relatively low, or minimal, amount of damage to the metal catalyst or to the tips or sidewalls of the silicon nanostructures. For example, in some embodiments, the lack of solution oxidizer slows down the sidewall and tip etching of the silicon nanostructures, e.g., SiNWs.

As used herein, the term "nanostructure" is intended to mean a structure that has at least one lateral dimension that is less than about 1000 nm in size, e.g., is about 1 nm to 500 nm in size, or is about 1 nm to 1000 nm in size, or is about 100 nm to 1000 nm in size, or is about 50 nm to 500 nm in size, or is about 10 nm to 100 nm in size. As used herein, the term "ultra-long" is intended to mean at least about 100 µm in length, e.g., is at least about 250 µm in length, or is at least about 500 µm in length, or is at least about 800 µm in length.

In an embodiment, the present invention provides a method for forming and/or for transferring ultra-long silicon nanostructures, e.g., silicon nanowires, from a bulk silicon wafer. The method can include any suitable combination of one or more of the three following processes: (1) patterning of a metal catalyst on a silicon wafer, (2) etching the silicon wafer to form silicon nanostructures, e.g., SiNWs, or (3) removing or transferring the silicon nanostructures, e.g., SiNWs, by controlled weakening of the silicon nanostructures, e.g., SiNWs, near their base regions.

Some embodiments of the present invention provide plurality of silicon nanostructures, each of the silicon nanostructures including a length and a cross-section, the cross-section being substantially constant along the length, the length being at least 100 microns. For example, the length can be at least 250 microns. Or, for example, the length can be at least 500 microns. The cross-section can include any suitable shape or size. For example, in some embodiments, the cross-section is substantially rectangular. Illustratively, the substantially rectangular cross-section area can be elongated, e.g., such that the nanostructures include nanoribbons. As another example, in some embodiments, the cross-section is substantially curved. Illustratively, the cross-section is substantially circular. The cross-section also can be "tubular" or "annular." In some embodiments, the cross-section varies by less than 50% along the length. For example, the cross-section can vary by less than 30% along the length. Or, for example, the cross-section can vary by less than 20% along the length. Or, for example, the cross-section can vary by less than 10% along the length. Or, for example, the cross-section can vary by less than 5% along the length. Note, however, that the cross-sectional area or cross-sectional shape of a nanostructure need not necessarily be substantially uniform along the length of that nanostructure. For example, the method described below with reference to FIG. 2 optionally can be adapted so as to modify the cross section in a desired manner along the length of the nanostructure.

Figure 1A:
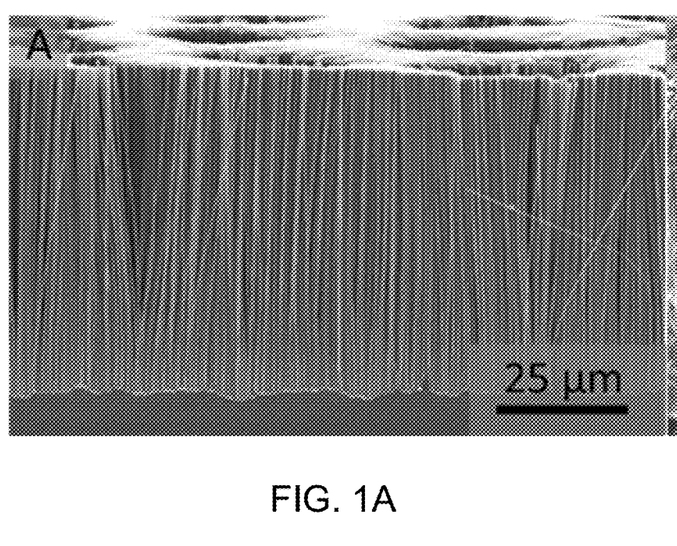
FIGS. 1A and 1B are SEM (Scanning Electron Microscope) images of a silicon nanostructure, e.g., nanowire, array, etched for (A) 1 hour and (B) further to nearly the whole thickness of about 525 µm of a four-inch wafer, according to an embodiment of the present invention.
Figure 1B:
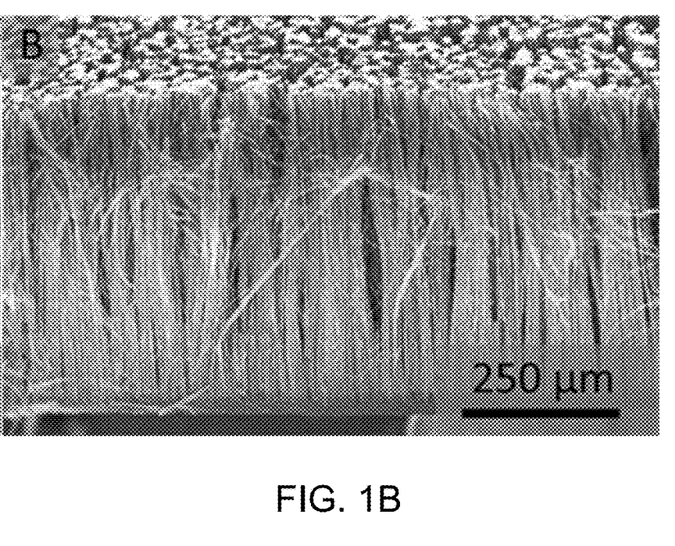

FIGS. 1A and 1B are SEM (Scanning Electron Microscope) images of a exemplary silicon nanostructure, e.g., nanowire, array, etched for (A) 1 hour and (B) further to nearly the whole thickness of about 525 µm of a four-inch wafer, according to an embodiment of the present invention. These diagrams are merely an example, which should not unduly limit the scope of the claims. One of ordinary skill in the art would recognize many variations, alternatives, and modifications.

In the nonlimiting embodiment illustrated in FIGS. 1A and 1B, the silicon nanostructures, e.g., nanowires, were formed using the method described in greater detail below with reference to FIG. 2 without the use of a solution oxidant, using the honeycomb shaped metal pattern described in greater detail below with reference to FIG. 3. The resulting silicon nanowires included a cross-section that was substantially circular, and that was substantially uniform along the length. However, it should be appreciated that silicon nanowires can have any suitable cross-sectional shape.

Figure 2:
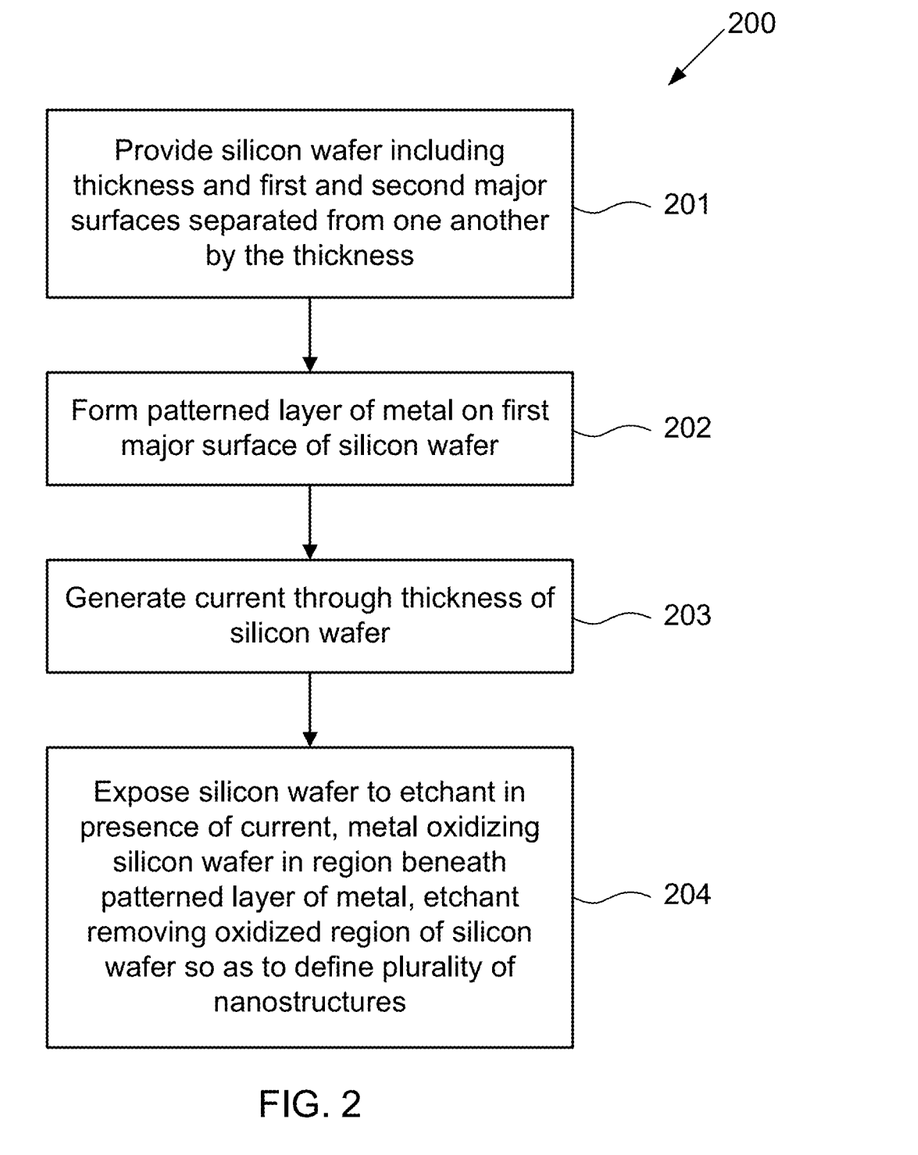
FIG. 2 illustrates an exemplary method for forming nanostructures, according to an embodiment of the present invention.

FIG. 2 illustrates an exemplary method for forming nanostructures, according to an embodiment of the present invention. This diagram is merely an example, which should not unduly limit the scope of the claims. One of ordinary skill in the art would recognize many variations, alternatives, and modifications. Method 200 illustrated in FIG. 2 includes providing a silicon wafer including a thickness and first and second major surfaces separated from one another by the thickness (201). The silicon wafer can have any suitable thickness and diameter. For example, commercially available 4 inch diameter silicon wafers can include a thickness of about 525 µm; commercially available 6 inch diameter silicon wafers can include a thickness of about 675 µm; commercially available 8 inch diameter silicon wafers can include a thickness of about 725 µm; and commercially available 12 inch diameter silicon wafers can include a 775 µm. However, it should be understood that any diameter silicon wafer suitably can be cut to a desired custom thickness. For example, 1 mm thick 6 inch diameter silicon wafers have been provided at step 201 of method 200. Additionally, note that the silicon wafer provided at step 201 suitably can be doped. The doping level potentially can affect the results of subsequent steps of method 200 (e.g., steps 203 and 204), so the variables implemented in such steps suitably can be selected based on the doping level. Additionally, note that silicon prefers to be etched along the [100] crystal plane direction, but any suitable crystal plane orientation suitably can be used. For example, the variables implemented during subsequent steps of method 200 (e.g., steps 203 and 204) suitably can be selected based on the crystal plane direction. Illustratively, for a high oxidation rate, the etch is anticipated to be vertical regardless of the wafer orientation (e.g. a high/low fluctuating current on a non-100 wafer may make a zigzag wire).

Method 200 illustrated in FIG. 2 further includes forming a patterned layer of metal on the first major surface of the silicon wafer (202). In a specific embodiment, the process of patterning of the metal can be performed in many ways including, but not limited to, the approaches below. As used herein, the patterned layer of metal also can be referred to herein as a "catalyst." However, it should be understood that in some embodiments, the metal can be consumed during the process. Exemplary metals that can be patterned during step 202 include Ag, Au, Pt, Pd, and Fe, or multilayer structures thereof, e.g., a AgAu multilayer (e.g., AgAu bilayer).

One non-limiting approach for forming a patterned layer of metal on the first major surface of the silicon wafer is via silver nitrate ($AgNO_3$), e.g., in which a solution process is used to pattern an Ag catalyst based on the random nucleation of Ag ions on the first major surface of the silicon wafer. The process includes placing the silicon wafer into a fixture that is compatible with an etchant, e.g., HF, and protecting the backside of the wafer from being reached by the solution to be used to deposit the metal, e.g., a solution including HF. For example, a fixture can makes a seal around the edge of the wafer so the solution to be used to deposit the metal substantially only contacts the front of the wafer and not the backside of the wafer. Additionally, the process can include coating the front side of the silicon wafer with a solution that includes, or is composed of, silver nitrate ($AgNO_3$), HF, and water. In one example, the solution includes an aqueous solution that includes 0.01 M $AgNO_3$ and 4.8 M HF. As is known in the art, the electrochemical potential of silver and positive silver ions is more positive than the Fermi energy of the silicon substrate, causing holes to be injected into the valence band of silicon from the positive silver ions, thus reducing the positive silver ions to elemental silver, which nucleates on the silicon surface and grows laterally from such nucleation sites. For further details, see the following references, the entire contents of each of which are incorporated by reference herein: Huang et al., "Metal-assisted chemical etching of silicon: a review," *Advanced Materials* 23: 285-308 (2011); Peng et al., "Fabrication of single-crystalline silicon nanowires by scratching a silicon surface with catalytic metal particles," *Advanced Functional Materials* 16: 387-394 (2006); and Peng et al, "Motility of metal nanoparticles in silicon and induced anisotropic silicon etching," *Advanced Functional Materials* 18: 3026-3035 (2008).

Optionally, ethanol or other additives can be added to the solution to adjust the pattern feature sizes and deposition rate. For example, solution that changes the surface energy of the solution can change how the metal, e.g., silver, is deposited. Solvent/surfactants potentially can lead to smaller feature sizes, while thickening the solution potentially can lead to larger feature sizes. As little as a few percent of an additive solution potentially can change how the silver is deposited. Additionally, a variety of agitation conditions can also be used to affect the deposition uniformity and rate. For example, faster agitation potentially can lead to faster deposition rates from local increases in the solution composition, which potentially can lead to smaller feature sizes and thicker films. After a desired amount of time, e.g., 30 seconds to 5 minutes, the process further includes thoroughly rinsing off any residual solution, e.g., with water. What is left after the rinsing step includes a patterned silver film (e.g., a substantially pure silver film) overlying the first major surface of the silicon wafer. Other suitable solution-based processes for forming other metal based films, including deposition of gold using colloidal gold particles or $KAuCl_4$, alternatively can be used.

Another non-limiting approach for forming a patterned layer of metal on the first major surface of a silicon wafer is via deposition of a metal (catalyst) over a patterned sacrificial layer, such as a monolayer of nanospheres. The patterned sacrificial layer can be formed using any suitable technique. In one nonlimiting embodiment, the process uses a controlled template technique to form a periodically patterned sacrificial layer with uniform sized features. The process can include depositing a plurality of nanoscale objects on the first major surface of the silicon wafer, such as a monolayer of nanospheres on a silicon wafer surface. The spheres can be made from, or can include, silica, polystyrene, or any other suitable material that subsequently can be removed from the silicon wafer surface. In an exemplary implementation, the nanospheres include silica spheres made using a modified Stöber synthesis process, which can produce silica particles having diameters in the range of approximately 50-2000 nm, or in the range of about 150-500 nm. Optionally, the size of the silica spheres can be further reduced, e.g., down to about a few tens or hundreds of nanometers, using a reactive ion etching method. In addition to reducing the size of silica spheres, the reactive ion etching method further can make the spheres non-close packed so as to facilitate formation of a substantially continuous, honeycomb-patterned metal layer. For example, in one nonlimiting embodiment of forming nano-scaled silica spheres, the etchant gas for the above reactive ion etching is composed of, or includes, $CHF_3$ and $O_2$. In one example, a reactive ion etch process with $CHF_3$ and $O_2$ can form fluorocarbon polymers. Optionally, any residual fluorocarbon polymers from the nanosphere etching step may be removed, e.g., with $O_2$ plasma, based on an amount of such residual polymers that were removed using the reactive ion etch, e.g., $CHF_3$ reactive ion etch. For further details, see the following references, the entire contents of each of which are incorporated by reference herein: Bogush et al., "Preparation of monodisperse silica particles: control of size and mass fraction," *Journal of Non-Crystalline Solids* 104: 95-106 (1998); Huang et al., "Synthesis of uniform, spherical sub-100 nm silica particles using a conceptual modification of the classic LaMer model," *Colloids and Surfaces A: Physicochemical and Engineering Aspects* 360: 175-183 (2010); and Stöber et al., "Controlled growth of monodisperse silica spheres in the micron size range," *Journal of Colloid and Interface Science* 26: 62-69 (1968).

Regardless of the particular manner in which they are made, the patterned sacrificial layer, e.g., nanoscale objects, e.g., nanospheres, can be deposited on the surface of the silicon wafer by a variety of methods including, but not limited to, a Langmuir-Blodgett trough which can provide substantially uniform coverage across the silicon wafer. Other exemplary methods for depositing nanoscale objects on a silicon wafer include, but are not limited to, spin coating, drop casting, nano imprint lithography, interference lithography, photolithography, diblock copolymers, and anodized aluminum oxide (AAO) templates. In one nonlimiting example, the nanospheres or other nanoscale objects are deposited on the surface of the silicon wafer so as to form a non-close-packed monolayer, so as to provide a sufficient amount of space between the nanospheres or other nanoscale objects to deposit a sufficient amount of metal as to form a substantially continuous patterned film that can have apertures defined therein. Illustratively, the distance between each nanosphere or other nanoscale object can be between 25 and 300 nm, or can be greater than 300 nm. Moreover, a metal film is deposited, e.g., evaporated, over the nanospheres or other nanoscale objects, e.g., silica spheres. Exemplary metal deposition techniques that suitably may be used to deposit a metal layer over a patterned sacrificial layer, e.g., nanospheres or other nanoscale objects, e.g., silica spheres, include vapor deposition techniques such as physical vapor deposition, chemical vapor deposition, or atomic layer deposition. Exemplary physical vapor deposition techniques include, but are not limited to, evaporation, sputter deposition, electron beam physical vapor deposition, cathodic arc deposition, or pulsed laser deposition. The metal can be selected from a number of materials including Ag, Au, Pt, Pd, and Fe, or multilayer structures thereof, e.g., a AgAu multilayer (e.g., a bilayer of Ag and Au). Finally, the process optionally can include removing the nanospheres via any suitable method, such as sonication or adhesive removal treatment, resulting in a metal thin film with honeycomb shaped patterns. In some embodiments, silicon nanostructures, e.g., SiNWs, can still form even if the nanospheres or other nanoscale objects, e.g., silica spheres, are not removed. For example, the nanospheres or other nanoscale objects, e.g., silica spheres, can dissolve in the etchant applied during step 204, e.g., can dissolve in HF.

Figure 3A:
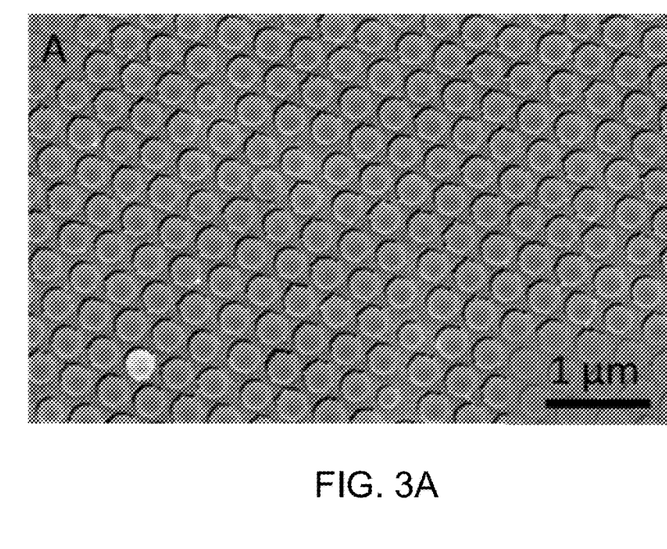
FIGS. 3A and 3B are SEM (Scanning Electron Microscope) images of a silicon wafer coated with (A) a monolayer of silica spheres and (B) following deposition of a metal over the monolayer of silica spheres of (A) and removal of the monolayer of silica spheres, a resulting metal film with honeycomb shaped nano-scaled pattern formed according to an embodiment of the present invention.
Figure 3B:
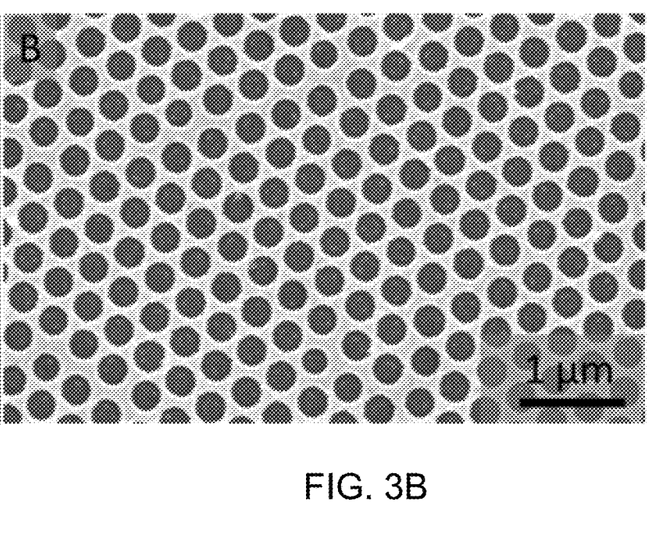

FIGS. 3A and 3B are SEM (Scanning Electron Microscope) images of a silicon wafer coated with (A) a monolayer of silica spheres and (B) following deposition of a metal over the monolayer of silica spheres of (A) and removal of the monolayer of silica spheres, a resulting metal film with honeycomb shaped nano-scaled pattern formed according to an embodiment of the present invention, although there are several variations and modifications. These diagrams are merely an example, which should not unduly limit the scope of the claims. One of ordinary skill in the art would recognize many variations, alternatives, and modifications. In the illustrative, nonlimiting example illustrated in FIG. 3A, a monolayer of silica spheres that had been made using the Stöber synthesis process, and subsequently reduced in size to approximately 250 nm using the above-mentioned reactive ion etch (RIE) process, was deposited on a silicon substrate using a Langmuir-Blodgett trough. Subsequently, 50 nm Ag was evaporated over the nanospheres, followed by evaporation of 20 nm of Au over the Ag, resulting in the structure illustrated in FIG. 3A. The nanospheres then were removed using sonication, resulting in the structure illustrated in FIG. 3B. It can be seen in FIG. 3B that the patterned layer of metal defines a plurality of curved apertures, e.g., circular apertures.

Yet another approach for forming a patterned layer of metal on the first major surface of the silicon wafer can include depositing a metal, forming a pattern on top of the metal, and then selectively removing portions of the metal in accordance with the pattern. For example, the metal can be deposited on the surface of the silicon wafer, e.g., using a physical vapor deposition technique such as mentioned above, and then photolithographically patterned using techniques well known in the art so as to remove portions of the metal in accordance with a desired pattern. Such patterning techniques suitably can be used to define any desired pattern in the metal, e.g., can be used so as to define apertures that are polygons, curves, or irregular shapes. In one nonlimiting embodiment, the polygons include rectangles, e.g., can include squares or can be elongated. In another nonlimiting embodiment, the curves define ovals or one or more circles. For example, the curves can define an annular (donut-shaped) aperture. However, it should be appreciated that any suitable pattern can be defined in the metal.

Referring again to FIG. 2, method 200 further includes generating a current through the thickness of the silicon wafer (203). The current can be in any suitable direction relative to the first and second major surfaces of the silicon wafer, and can have any suitable spatial and temporal pattern. In one nonlimiting example, the current can be substantially perpendicular to the first and second major surfaces of the silicon wafer. In another nonlimiting example, the current can be substantially spatially uniform over the surface of the wafer. In another nonlimiting example, the current can be substantially uniform as a function of time. Illustratively, the current can be substantially perpendicular to the first and second major surfaces of the wafer, can be substantially spatially uniform over the surface of the surface of the wafer, and can be substantially uniform as a function of time.

The current can be generated using any suitable technique. For example, the current can be generated using an anode positioned on one side of the silicon wafer, and a cathode positioned on the other side of the silicon wafer. Optionally, either the anode or the cathode can be disposed on the silicon wafer, e.g., on the back side of the silicon wafer. For example, a metal film, such as an aluminum film, suitably can be disposed on the second major surface of the silicon wafer at any suitable before or during method 200. Illustratively, the process can include coating the backside of a silicon wafer with an Al film and annealing at 400° C. for 30 minutes or more so as to form an electrical contact to the backside of the silicon wafer, although many other methods would also work. The other of the anode and cathode can be disposed at a spaced distance from the first major surface of the silicon wafer. The cathode, anode, and wafer can be disposed in a conductive medium (e.g., a solution including the etchant of step 204 described below) and a voltage applied so as to generate a current through the thickness of the silicon wafer. Illustratively, current densities in the range of about 1-100 mA/cm$^2$ can be used, e.g., in the range of about 10-30 mA/cm$^2$. Illustratively, voltages can depend on size, but for a full wafer can be in the exemplary range of about 0.3 V to 4V. In one nonlimiting embodiment in which the silicon wafer has a 6 inch diameter, the current is about 3 A and the voltage is about 2.0V. However, it should be appreciated that a current can be generated through the thickness of the silicon wafer using any other suitable technique. As one example, the silicon wafer (e.g., the second major surface of the silicon wafer) can be irradiated with a suitable wavelength and flux of light so as to induce a photocurrent through the thickness of the silicon wafer. Illustratively, an anode and a cathode can be omitted, the first major surface of the silicon wafer, the second major surface of the silicon wafer, or both the first and second major surfaces of the silicon wafer, can be exposed to a suitable light source so as to create electron/hole pairs.

Still referring to FIG. 2, method 200 further includes exposing the silicon wafer to an etchant in the presence of the current, the metal oxidizing the silicon wafer in region(s) beneath the patterned layer of metal, the etchant removing the oxidized region(s) of the silicon wafer so as to define a plurality of nanostructures (204). In some embodiments, the etching proceeds anisotropically. In some embodiments, the etchant can include a solution based chemical etchant or a vapor based chemical etchant. In some embodiments, the etchant can include hydrofluoric acid (HF), which can be in liquid or vapor form and can be diluted with solvents or other solution additives to change the solution resistivity which would impact the electric field. Illustratively, a suitable amount of the etchant, e.g., HF, can be dissolved in any suitable solvent, such as water, ethanol, isopropyl alcohol, methanol, hexane, or toluene, or any suitable combination thereof, e.g., hexane toluene. Illustratively, the etchant, e.g., HF, can have a concentration of about 0.5-30 M in the solvent, e.g., about 3-15 M in the solvent, e.g., about 8-12 M in the solvent, e.g., about 10 M in the solvent. In some embodiments, the higher the concentration of HF, the less internally porous are the silicon nanostructures (e.g., SiNW) and the faster the etch rate. For example, an individual silicon nanostructure (e.g., SiNW) etched by this method can include a plurality of internal etch sites inside the nanostructure, resulting in an internal porosity. Variables such as the etchant (e.g., HF) concentration, starting wafer doping level, applied current, and metal composition can affect the degree of this internal porosity. Optionally, the solution further can include an oxidant, although some embodiments exclude the use of a solution based oxidant.

In one illustrative embodiment, the metal first can oxidize initial region(s) of the silicon, e.g., region(s) at and near the top surface of the silicon wafer, in the presence of the current and based on the pattern of the metal, and the etchant can remove the oxidized region(s) so as to define relatively short nanostructures. The current can cause the metal to be transported further into the thickness of the silicon wafer, still in accordance with the pattern, so as to oxidize a deeper portion of the silicon with substantially the same pattern as the initial region(s), and the etchant can remove the oxidized region(s) so as to define somewhat longer nanostructures having substantially the same cross-section as the initial region(s). The process of transporting the metal to deeper portions of the silicon with substantially the same pattern as the initial region(s) and removing the resulting oxidized region(s) suitably can be continued for any desired period of time, so as to define a plurality of nanostructures including any desired length, e.g., a length up to approximately the thickness of the silicon wafer, and including cross-sections that, in some embodiments, are substantially uniform along the length. Illustratively, in embodiments in which the patterned layer of metal defines a plurality of rectangularly shaped apertures, the nanostructures can include rectangularly shaped cross-sections substantially corresponding to the plurality of rectangularly shaped apertures. For example, the rectangularly shaped apertures can be elongated, and wherein the nanostructures include nanoribbons. Or, illustratively, in embodiments in which the patterned layer of metal defines a plurality of curved apertures, the nanostructures include curved cross sections substantially corresponding to the plurality of circularly shaped apertures. For example, the plurality of curved apertures can include circles, and the nanostructures can include circular cross-sections. As another example, the plurality of curved apertures can include annular apertures, and the nanostructures can include nano-scale tubular structures. Optionally, the nanostructures are ultra-long, e.g., can include nanostructures such as described herein with reference to FIGS. 1A-1B.

Optionally, the current applied through the thickness of the silicon wafer can be adjusted or modulated as a function of time so as suitably to shape the nanostructures along their lengths. For example, if a (100) silicon wafer is used, then the silicon nanostructures, e.g., SiNWs, can have a porous and a nonporous structure correlated to the current. If a non (100) wafer is used, then the silicon nanostructures, e.g., SiNWs, can have a zigzag shape with the vertical direction corresponding to high current and the 100 (non vertical) direction corresponding to low currents. In one example, when a non (100) wafer is used, zigzag silicon nanostructures, e.g., SiNWs, can form because the low current can allow the oxidation to occur along the least density packed plane (100) which is not vertical. At high current in non (100) wafers, the electric field can be strong enough to direct the etch downward, even if it is not the least densely packed plane. In one example when a (100) wafer is used, when the current is low, etch pathways can be less likely to form in the silicon nanostructures, resulting in a lower internal porosity, whereas when the current is high, more "uncontrolled" etch pathways potentially can be present, leading to the silicon nanostructure internal porosity being higher.

In one exemplary embodiment, the process of etching the silicon wafer to form nanostructures, e.g., SiNWs, includes performing a current-induced MACE process. In a specific implementation, a silicon wafer containing the metal (catalyst) and having an aluminum back contact is placed inside a fixture that is compatible with HF and protects the backside of the wafer from being in contact with any HF solution. The fixture is filled with a solution including, or composed of, HF and water. A platinum wire supported by a Teflon fixture is inserted into the HF and water solution to act as a counter electrode. A constant current is applied between the back of the wafer and the counter electrode, causing the oxidation of silicon material under the patterned catalyst and subsequent removal by the HF in the area under the patterned catalyst. The etching step continues forming a silicon nanostructure, e.g., SiNW, under the metal patterned catalyst (e.g., nano-scaled spheres), optionally with a linear rate until the applied current is turned off. FIGS. 1A and 1B are SEM (Scanning Electron Microscope) images of a silicon nanostructure, e.g., nanowire, array, etched using such a method for (A) 1 hour and (B) further to nearly the whole thickness of about 525 μm of a four-inch wafer, according to an embodiment of the present invention.

Furthermore, the facile collection of the ultra-long nanostructures, e.g., SiNWs, substantially without infringing damage to the nanostructures, e.g., SiNWs, or including large bulk silicon chuck (remaining silicon substrate at the end of method 200) can be useful for making these nanostructures, e.g., SiNWs, ready for thermoelectric applications. The silicon nanostructures, e.g., SiNWs, can be removed or transferred from the remaining silicon substrate at the end of the etch process mentioned above, allowing the collection of the silicon nanostructures, e.g., SiNWs, from the surface of the solution.

Figure 4:
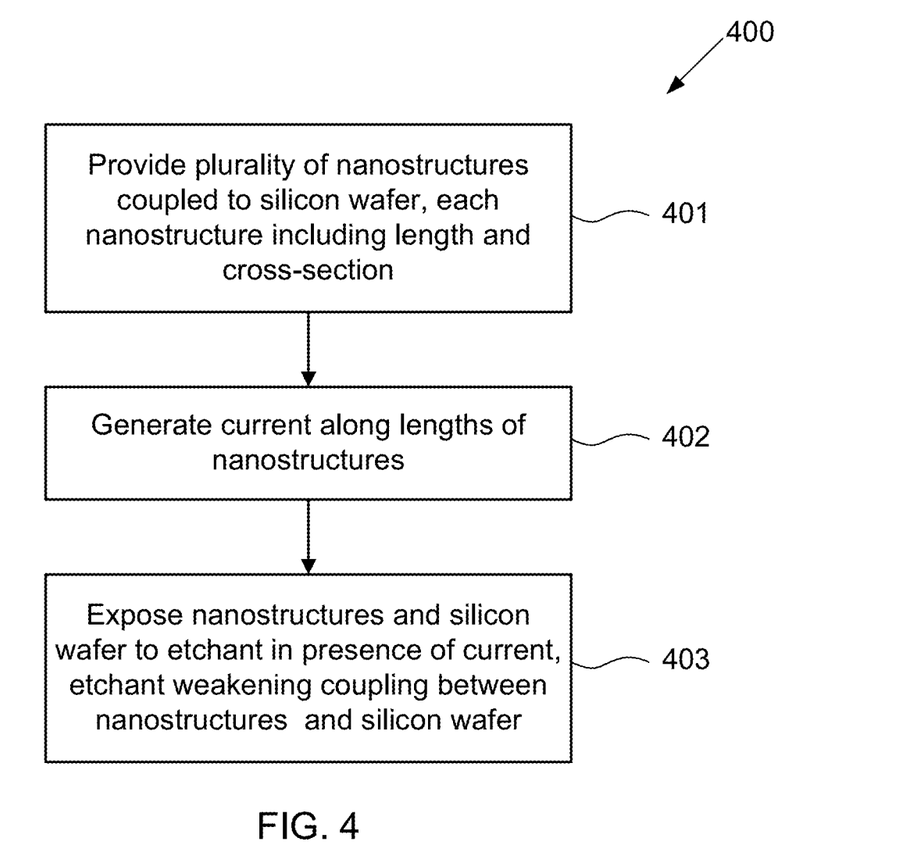
FIG. 4 illustrates an exemplary method for transferring nanostructures, according to an embodiment of the present invention.

FIG. 4 illustrates an exemplary method for transferring nanostructures, according to an embodiment of the present invention. This diagram is merely an example, which should not unduly limit the scope of the claims. One of ordinary skill in the art would recognize many variations, alternatives, and modifications. Method 400 illustrated in FIG. 4 includes providing a plurality of nanostructures coupled to a silicon wafer, each nanostructure including a length and a cross-section (401). In one nonlimiting example, the nanostructures can include nanostructures such as described herein with reference to FIGS. 1A-1B. In one nonlimiting example, the nanostructures can be formed using a method such as method 200 described herein with reference to FIGS. 2 and 3A-3B. The silicon wafer to which the nanostructures are coupled can include a remaining portion of the silicon wafer following implementation of method 200.

Method 400 illustrated in FIG. 4 further includes generating a current along the lengths of the nanostructures (402). Illustratively, the current can be generated in a manner analogous to that described herein with reference to step 203 of FIG. 2. Indeed, in certain embodiments, the plurality of nanostructures and the remaining portion of the silicon wafer can remain in place following method 200, e.g., can remain in a suitable reaction vessel and in the presence of a current such as in step 203. However, the current of step 402 illustrated in FIG. 4 optionally can vary relative to the current of step 203 illustrated in FIG. 2. For example, the current of step 402 can be stronger than the current of step 203, or can be weaker than the current of step 203. Optionally, a metal layer defining a cathode or anode can be disposed on a second major surface of the silicon wafer (e.g., a major surface opposite to, and parallel to, a major surface to which the nanostructures are coupled). Such metal layer can be used to generate a current during step 203 of method 200 and also can be used to generate a current during step 402 of method 400. Other suitable methods of generating a current along the lengths of the nanostructures suitably can be used.

Method 400 illustrated in FIG. 4 further includes exposing the nanostructures and the silicon wafer to an etchant in the presence of a current, the etchant weakening the coupling between the nanostructures and the silicon wafer (403). A useful parameter is the ratio of current to etchant, e.g., HF. For example, during normal etching such as described above with reference to method 200 illustrated in FIG. 2, the etching rate can be faster than the oxidation rate. In some embodiments, to weaken the coupling between the silicon nanostructures and the silicon wafer during step 403, a large porous region can be formed by having the oxidation rate be faster than the rate at which the etchant (e.g., HF) can remove the oxidized regions, which potentially can lead to a large oxidized area that the etchant (e.g., HF) then removes and releases the silicon nanostructures, e.g., SiNWs. Illustratively, during step 403, substantially the same etchant concentration can be used as in step 204 described above with reference to FIG. 2, and the current used during steps 402 and 403 can be at least twice, or at least three times, or at least four times the current used during steps 203 and 204. Or, illustratively, during steps 402 and 403, substantially the same current can be used as in steps 203 and 204 described above with reference to FIG. 2, and the etchant concentration used during step 403 can be at least twice, or at least three times, or at least four times the etchant concentration used during step 204.

Additionally note that the patterned layer of metal formed during step 202 described in greater detail above with reference to FIG. 2 can be, but need not necessarily, be present during step 403 of method 404. For example, under conditions such as described herein with reference to step 403, the etch can be a more isotropic etch, so as to undercut the silicon nanostructures, e.g., SiNWs, as compared to that in step 204. If present during step 403, it is anticipated that the metal can slightly change the reaction. For example, based upon the metal being present, the area at the silicon nanostructure (e.g., SiNW) base under the metal can oxidize slightly faster than the area beneath the silicon nanostructure (e.g., SiNW) base where there is no metal. Both areas, however, can still be oxidized due to the fast rate (high current) or slow oxide removal rate (low etchant, e.g., HF). If the metal is removed, the oxidation rate beneath the silicon nanostructures (e.g., SiNWs) and between the silicon nanostructures (e.g., SiNWs) (under metal) can be expected to oxidize at rates that are more comparable to one another. Accordingly, it is anticipated that the undercutting can be more uniform if the metal is removed.

Illustratively, the etchant can be analogous to that described herein with reference to step 204 of FIG. 2. Indeed, in certain embodiments, the plurality of nanostructures and the remaining portion of the silicon wafer can remain in place following method 200, e.g., can remain in a suitable reaction vessel and in the presence of an etchant such as in step 204. However, the etching of step 403 illustrated in FIG. 4 optionally can vary relative to the etching of step 204 illustrated in FIG. 2. For example, the etchant of step 403 can be at a higher concentration, or a lower concentration, or can include a different or additional etchant or other chemical agent, relative to the etchant of step 204. Additionally, or alternatively, and as noted above, the current of step 402 illustrated in FIG. 4 optionally can vary relative to the current of step 203 illustrated in FIG. 2. For example, the current of step 402 can be stronger than the current of step 203, or can be weaker than the current of step 203. As such, one or both of the etching and the current can be varied, relative to those used in defining the nanostructures, in a manner suitable to weaken the coupling between the nanostructures and the silicon wafer. Optionally, weakening the coupling between the nanostructures and the silicon wafer includes detaching the nanostructures from the silicon wafer. Alternatively, the coupling can be weakened without detaching the nanostructures from the silicon wafer using method 400 illustrated in FIG. 4.

In one nonlimiting, purely illustrative embodiment, the process of transferring includes removing the entire silicon nanostructures, e.g., SiNWs, from (the remaining portion of) the Si wafer. In particular, the process includes a removal process using an electropolishing technique. At the end of a desired etch time, the silicon nanostructures, e.g., SiNWs, can be removed by electropolishing the interface between the base of the silicon nanostructures, e.g., SiNWs, and bulk silicon substrate. This can be achieved by at least one of following two methods or a combination of both. Firstly, one exemplary method includes significantly increasing the current applied through the counter electrode (e.g., electrode spaced apart from the silicon wafer) relative to that used in steps 203 and 204 of method 200, in the same solution as was used for performing silicon nanostructure, e.g., nanowire, etching (e.g., the same solution as in step 204 of method 200 illustrated in FIG. 2). Secondly, another exemplary method includes replacing the previous etching solution (of step 204 of method 200 illustrated in FIG. 2) with a solution having a lower concentration of etchant, e.g., a lower concentration of HF. Illustratively, the removal process can take about a couple of seconds and the silicon nanostructures, e.g., SiNWs, formed across the entire wafer can be released from the base regions of silicon nanostructures, e.g., nanowires, and can float to the surface of the solution where they can be collected.

Alternatively, the silicon nanostructures, e.g., SiNWs, can be left attached to the silicon substrate for handling and optionally can be released at a later time, e.g., optionally can be temporarily kept attached to the silicon wafer. In particular, the process of transferring can include controlled chemical weakening of the silicon nanostructures, e.g., SiNWs. In particular, this process can include weakening specifically at the silicon nanostructure, e.g., SiNW, base regions which, in some embodiments, can be achieved using a less severe treatment condition as the removal of the silicon nanostructures, e.g., SiNWs discussed above. In some embodiments, this treatment condition includes using a lower (less) concentration of etchant, e.g., HF, and temporarily increasing current to a level less than that which would be used in the removal of SiNWs. The treatment can form a highly short porous layer at the base regions of the silicon nanostructure, e.g., SiNW, array. These short porous layers can serve as controlled weak points of the ultra-long silicon nanostructures, e.g., SiNWs. When the sample having the ultra-long silicon nanostructures, e.g., SiNWs, is taken out of the etching solution, these silicon nanostructure, e.g., SiNW, array optionally can be collected subsequently by subjecting to a mechanical removal process. As the weak points built around the base regions of the silicon nanostructures, e.g., SiNWs, the mechanical removal process will cause a relatively small, or minimum, alteration or damage to the main bodies part of the silicon nanostructures, e.g., SiNWs.

Figure 5A:
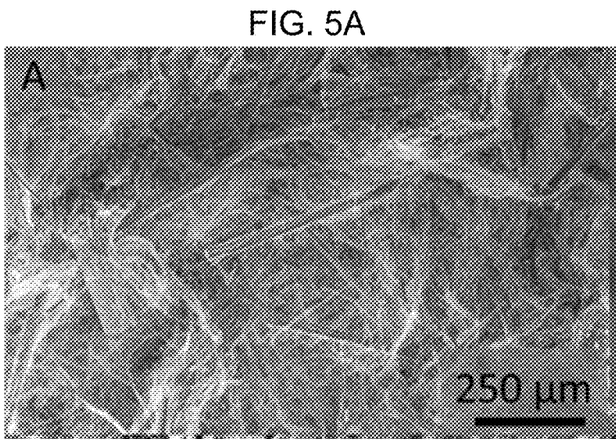
FIG. 5A shows a low magnification image of the silicon nanostructures, e.g., SiNWs, after removal.
Figure 5B:
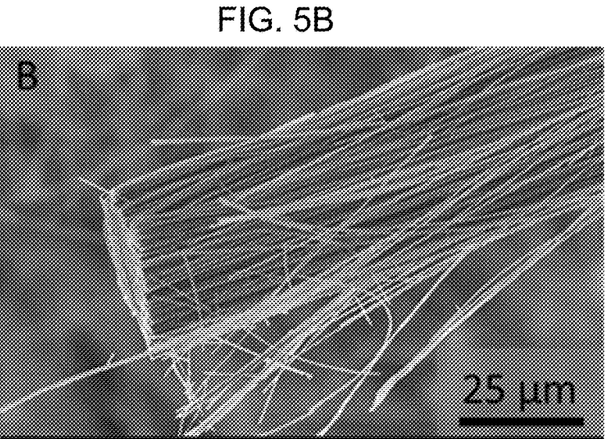
FIGS. 5B and 5C are higher magnification images respectively showing two local regions of FIG. 5A with the silicon nanostructure, e.g., SiNW, bundles and silicon nanostructure, e.g., SiNW, mesh.
Figure 5C:
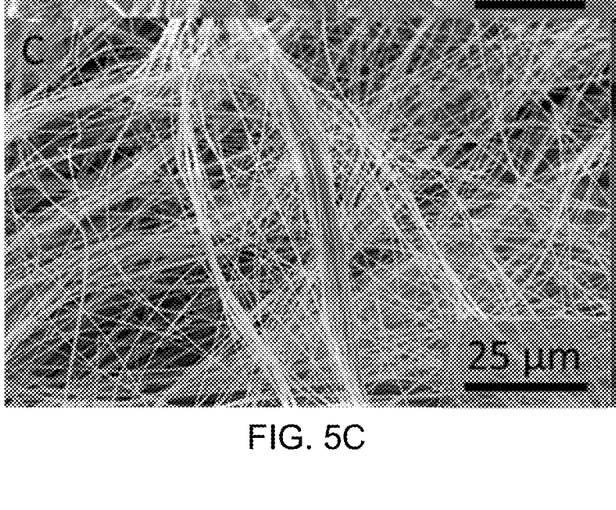
Figure 5D:
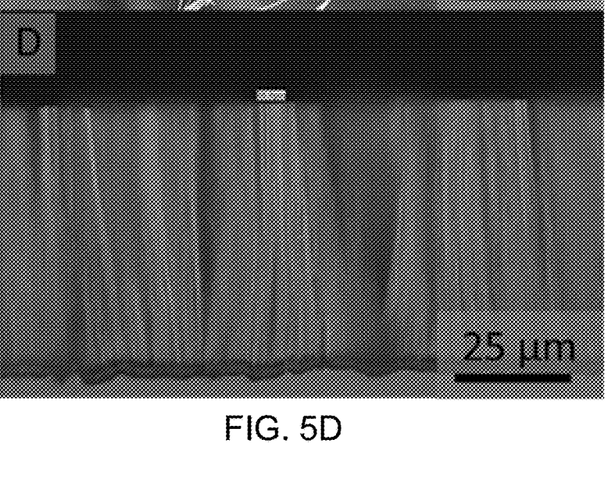
FIG. 5D is an optical microscope image showing the controlled weakening at the silicon nanostructure, e.g., SiNW, base regions created with a temporal increase in applied current for etching the silicon nanostructures, e.g., SiNWs, according to another specific embodiment of the present invention.

FIGS. 5A-5C are SEM images of silicon nanostructures, e.g., SiNWs, etched and removed from Si substrate according to a specific embodiment of the present invention. FIG. 5A shows a low magnification image of the silicon nanostructures, e.g., SiNWs, after removal. FIGS. 5B and 5C are higher magnification images respectively showing two local regions of FIG. 5A with the silicon nanostructure, e.g., SiNW, bundles and silicon nanostructure, e.g., SiNW, mesh. FIG. 5D is an optical microscope image showing the controlled weakening at the silicon nanostructure, e.g., SiNW, base regions created with a temporal increase in applied current for etching the silicon nanostructures, e.g., SiNWs, according to another specific embodiment of the present invention. These diagrams are merely an example, which should not unduly limit the scope of the claims. One of ordinary skill in the art would recognize many variations, alternatives, and modifications.

Many semiconductor processing techniques suitably can be used including electroless plating, chemical synthesis, Langmuir-Blodgett assembly, reactive ion etching, electron-beam evaporation, sonication, chemical etching. Many other processes could serve as alternatives.

Many advantages are provided by applying various embodiments of the present invention. For example, it allows formation of controlled and uniform ultra-long silicon nanostructure, e.g., SiNW, arrays. This means the silicon nanostructures, e.g., SiNWs, are relatively consistent from wafer to wafer, relatively uniform across a wafer, and relatively uniform along the axial direction (length) of the SiNWs. Embodiments of the present invention also allow a formation of ultra-long silicon nanostructures, e.g., SiNWs, that are limited only by the original wafer starting thickness and not by any chemical depletion or gradients. Certain embodiments of the invention further facilitate collection of the as-formed ultra-long silicon nanostructures, e.g., SiNWs, using controlled chemical removal or partial chemical weakening of the silicon nanowires at a desired location for the immediate or future separation the silicon nanowires from the bulk silicon substrate.

In one nonlimiting embodiment, a plurality of silicon nanostructures is provided. Each of the silicon nanostructures includes a length and a cross-section, the cross-section being substantially constant along the length, the length being at least 100 microns. Such a plurality of silicon nanostructures is described above, for example, with reference to FIGS. 1, 2, 4, and 5A-5C.

In another nonlimiting embodiment, a method of making nanostructures is provided that includes providing a silicon wafer including a thickness and first and second surfaces separated from one another by the thickness; forming a patterned layer of metal on the first surface of the silicon wafer; generating a current through the thickness of the silicon wafer, the metal oxidizing the silicon wafer in a region beneath the patterned layer of the metal; and exposing the silicon wafer to an etchant in the presence of the current, the etchant removing the oxidized region of the silicon wafer so as to define a plurality of nanostructures. Such a method is described above, for example, with reference to FIGS. 1, 2, and 3.

In another nonlimiting embodiment, a method of transferring nanowires is provided that includes providing a plurality of nanostructures coupled to a silicon wafer, each nanowire including a length and a cross-sectional area; generating a current along the lengths of the nanowires; and exposing the nanowires and the silicon wafer to an etchant in the presence of a current, the etchant weakening the coupling between the nanowires and the silicon wafer. Such a method is described above, for example, with reference to FIGS. 4 and 5A-5C.

It is also understood that the examples and embodiments described herein are for illustrative purposes only and that various modifications or changes in light thereof will be suggested to persons skilled in the art and are to be included within the spirit and purview of this application and scope of the claims.

What is claimed is:

1. A method of making nanostructures, the method comprising:
   providing a silicon wafer including a thickness and first and second surfaces separated from one another by the thickness;
   forming a patterned layer of metal on the first surface of the silicon wafer;
   generating a current through the thickness of the silicon wafer, the metal oxidizing the silicon wafer in a region beneath the patterned layer of the metal; and
   exposing the silicon wafer to an etchant in the presence of the current, the etchant removing the oxidized region of the silicon wafer so as to define a plurality of nanostructures.

2. The method of claim 1, each of the silicon nanostructures including a length of at least 100 microns.

3. The method of claim 1, each of the silicon nanostructures including a length of at least 250 microns.

4. The method of claim 1, each of the silicon nanostructures including a length of at least 500 microns.

5. The method of claim 1, the current flowing in a direction that is substantially perpendicular to the first and second surfaces.

6. The method of claim 1, comprising generating the current with first and second electrodes.

7. The method of claim 1, comprising generating the current by illuminating the silicon wafer with light.

8. The method of claim 1, wherein the patterned layer of metal defines a plurality of rectangularly shaped apertures, and the nanostructures include rectangularly shaped cross-sections substantially corresponding to the plurality of rectangularly shaped apertures.

9. The method of claim 8, wherein the rectangularly shaped apertures are elongated, and wherein the nanostructures include nanoribbons.

10. The method of claim 1, wherein the patterned layer of metal defines a plurality of curved apertures, and the nanostructures include curved cross sections substantially corresponding to the plurality of curved apertures.

11. The method of claim 10, wherein the plurality of curved apertures include circles.

12. A method of transferring nanowires, the method comprising:
   providing a plurality of nanostructures coupled to a silicon wafer, each nanowire including a length and a cross-sectional area;
   generating a current along the lengths of the nanowires; and
   exposing the nanowires and the silicon wafer to an etchant in the presence of a current, the etchant weakening the coupling between the nanowires and the silicon wafer.

13. The method of claim 12, each of the silicon nanostructures including a length of at least 100 microns.

14. The method of claim 12, each of the silicon nanostructures including a length of at least 250 microns.

15. The method of claim 12, each of the silicon nanostructures including a length of at least 500 microns.

* * * * *